United States Patent
Tu et al.

(10) Patent No.: US 10,924,879 B2
(45) Date of Patent: Feb. 16, 2021

(54) SOUND EFFECT CONTROLLING METHOD AND SOUND OUTPUTTING DEVICE WITH DYNAMIC GAIN ADJUSTMENT

(71) Applicant: ACER INCORPORATED, New Taipei (TW)

(72) Inventors: Po-Jen Tu, New Taipei (TW); Jia-Ren Chang, New Taipei (TW); Kai-Meng Tzeng, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 0 days.

(21) Appl. No.: 16/559,038

(22) Filed: Sep. 3, 2019

(65) Prior Publication Data
US 2020/0084565 A1 Mar. 12, 2020

(30) Foreign Application Priority Data
Sep. 6, 2018 (TW) .............................. 107131315 A

(51) Int. Cl.
*H04S 7/00* (2006.01)
*H04S 3/00* (2006.01)
(Continued)

(52) U.S. Cl.
CPC .............. *H04S 7/304* (2013.01); *G06F 3/011* (2013.01); *H03G 3/20* (2013.01); *H04S 3/002* (2013.01);
(Continued)

(58) Field of Classification Search
CPC .......... H04S 7/304; H04S 7/302; H04S 7/303; H04S 3/002; H04S 2400/15;
(Continued)

(56) References Cited

U.S. PATENT DOCUMENTS 6,021,206 A * 2/2000 McGrath ................. H04S 3/004
381/310
6,108,430 A * 8/2000 Kurisu .................... H04S 7/304
381/309
(Continued)

FOREIGN PATENT DOCUMENTS

TW 201828712 A 8/2018

*Primary Examiner* — Jason R Kurr
(74) *Attorney, Agent, or Firm* — Birch, Stewart, Kolasch & Birch, LLP

(57) ABSTRACT

A sound effect controlling method and a sound outputting device with dynamic gain adjustment are disclosed. The sound effect controlling method includes the following steps. An original left sound signal and an original right sound signal are transformed to a virtual center sound signal, a virtual left sound signal, a virtual left surrounding sound signal, a virtual right surrounding sound signal and a virtual right sound signal according to a center gain, a left gain, a left surrounding gain, a right surrounding gain and a right gain, which are calculated according to a rotation angle and a dual sound relationship. An updated left sound signal and an updated right sound signal are obtained according to the virtual center sound signal, the virtual left sound signal, the virtual left surrounding sound signal, the virtual right surrounding sound signal and the virtual right sound signal.

20 Claims, 8 Drawing Sheets

(51) Int. Cl.
*G06F 3/01* (2006.01)
*H03G 3/20* (2006.01)

(52) U.S. Cl.
CPC ....... *H04S 2400/15* (2013.01); *H04S 2420/01* (2013.01)

(58) Field of Classification Search
CPC ...... H04S 2420/01; H04S 1/005; H04S 3/004; H04S 5/005; H04S 2400/05; G06F 3/011; H03G 3/20
See application file for complete search history.

(56) References Cited

U.S. PATENT DOCUMENTS

| | | | |
|---|---|---|---|
| 2006/0045294 A1* | 3/2006 | Smyth | H04S 7/304 381/309 |
| 2007/0025560 A1 | 2/2007 | Asada | |
| 2012/0057150 A1* | 3/2012 | Hess | H04R 5/04 356/138 |
| 2017/0353812 A1* | 12/2017 | Schaefer | H04R 3/04 |
| 2018/0359596 A1* | 12/2018 | Breebaart | H04S 3/008 |

* cited by examiner

SOUND EFFECT CONTROLLING METHOD AND SOUND OUTPUTTING DEVICE WITH DYNAMIC GAIN ADJUSTMENT

This application claims the benefit of Taiwan application Serial No. 107131315, filed Sep. 6, 2018, the subject matter of which is incorporated herein by reference.

BACKGROUND OF THE INVENTION

Field of the Invention

The invention relates in general to a sound effect controlling method and a sound outputting device, and more particularly to a sound effect controlling method and a sound outputting device with dynamic gain adjustment.

Description of the Related Art

Along with the advance of the interactive display technology, various interactive display devices are provided one after another. Let the head-mounted display (HMD) be taken for example. When the user wears the head-mounted display, the user can see a virtual reality (VR) image. As the user moves or rotates, the head-mounted display can display corresponding images, providing a sense of presence to the user.

According to the current application, although the display image can vary with the user's rotation, audio signals still remain unchanged, making the user's feeling of presence greatly jeopardized.

Particularly in a multi-channel application, when the user rotates, if the change in the ratio between the multi channels is not adjusted along with the user's rotation angle, the user's sense of presence will be greatly reduced.

SUMMARY OF THE INVENTION

The invention is directed to a sound effect controlling method and a sound outputting device with dynamic gain adjustment. Through the arrangement of the angles of the 5-channel virtual signals and the dynamic adjustment of the gain in 5 channels, when the user rotates, the 5-channel virtual signals can be correspondingly adjusted and the sense of presence of 5 channels can be greatly increased.

According to one embodiment of the present invention, a sound effect controlling method with dynamic gain adjustment is disclosed. The sound effect controlling method with dynamic gain adjustment includes the following steps. An original left sound signal and an original right sound signal are received. A dual sound relationship is calculated according to the original left sound signal and the original right sound signal. A center gain, a left gain, a left surrounding gain, a right surrounding gain and a right gain are calculated according to a rotation angle and the dual sound relationship, wherein the center gain is different from the left gain and the right gain. The original left sound signal and the original right sound signal are transformed to a virtual center sound signal, a virtual left sound signal, a virtual left surrounding sound signal, a virtual right surrounding sound signal and a virtual right sound signal according to the center gain, the left gain, the left surrounding gain, the right surrounding gain and the right gain. An updated left sound signal and an updated right sound signal are obtained according to the virtual center sound signal, the virtual left sound signal, the virtual left surrounding sound signal, the virtual right surrounding sound signal and the virtual right sound signal.

According to another embodiment of the present invention, a sound outputting device with dynamic gain adjustment is disclosed. The sound outputting device includes a reception unit, a correlation calculation unit, a gain calculation unit, a transformation unit and a synthesizing unit. The reception unit receives an original left sound signal and an original right sound signal. The correlation calculation unit calculates a dual sound relationship according to the original left sound signal and the original right sound signal. The gain calculation unit calculates a center gain, a left gain, a left surrounding gain, a right surrounding gain and a right gain according to a rotation angle and the dual sound relationship, wherein the center gain is different from the left gain and the right gain. The transformation unit transforms the original left sound signal and the original right sound signal to a virtual center sound signal, a virtual left sound signal, a virtual left surrounding sound signal, a virtual right surrounding sound signal and a virtual right sound signal according to the center gain, the left gain, the left surrounding gain, the right surrounding gain and the right gain. The synthesizing unit obtains an updated left sound signal and an updated right sound signal according to the virtual center sound signal, the virtual left sound signal, the virtual left surrounding sound signal, the virtual right surrounding sound signal and the virtual right sound signal.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
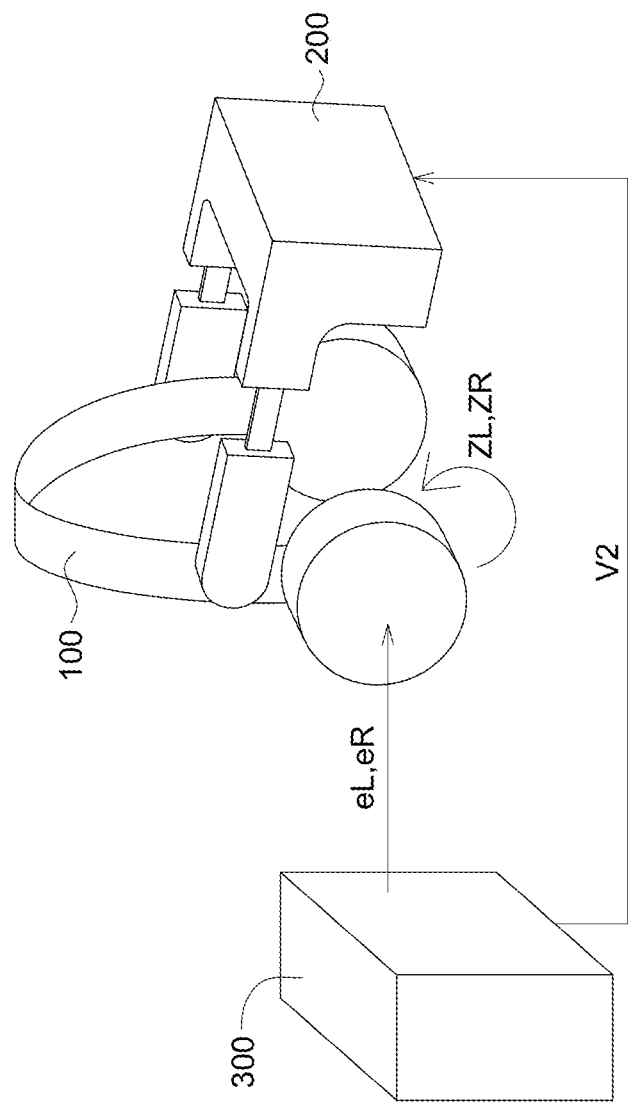
FIG. 1 is a schematic diagram of a sound outputting device, a head-mounted display and a computing device according to an embodiment.

Referring to FIG. 1, a schematic diagram of a sound outputting device 100, a head-mounted display 200 and a computing device 300 according to an embodiment is shown. The sound outputting device 100 can work with the head-mounted display 200 for allowing the user to play virtual reality (VR) games or visit virtual stores. The display content V2 of the head-mounted display 200 and an original left sound signal eL and an original right sound signal eR of the sound outputting device 100 are provided by the computing device 300. As the user rotates, the display content V2 will change accordingly. In the present embodiment, the original left sound signal eL and the original right sound signal eR can be transformed to an updated left sound signal ZL and an updated right sound signal ZR according to the user's rotation. The updated left sound signal ZL and the updated right sound signal ZR are 5-channel simulation signals obtained by simulating 5 virtual speakers according to the user's rotation, and the gain of the 5-channel simulation signal can be dynamically adjusted to increase the user's feeling of presence.

Figure 2:
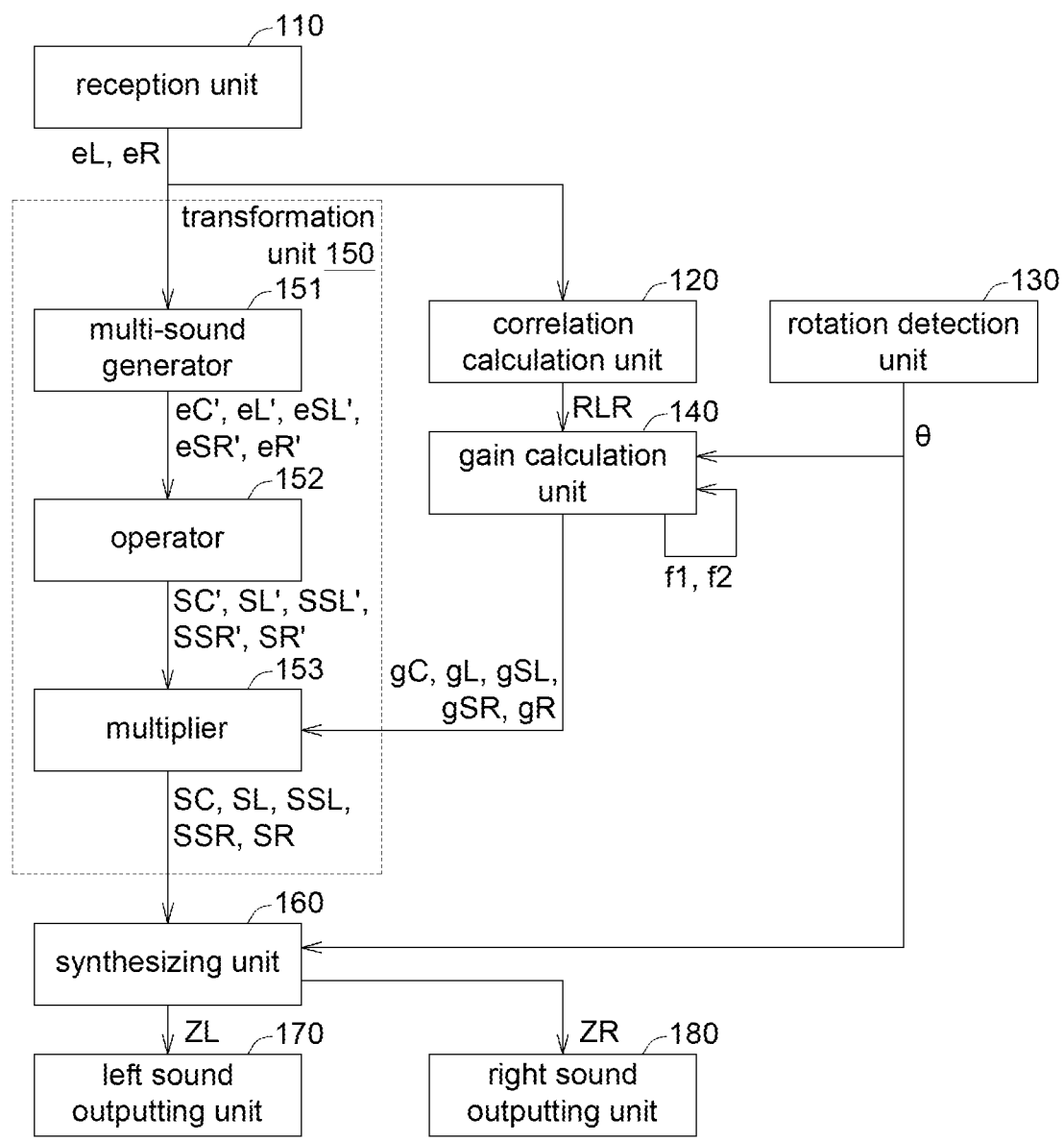
FIG. 2 is a block diagram of a sound outputting device according to an embodiment.

Referring to FIG. 2, a block diagram of a sound outputting device 100 according to an embodiment is shown. The sound outputting device 100 includes a reception unit 110, a correlation calculation unit 120, a rotation detection unit 130, a gain calculation unit 140, a transformation unit 150, a synthesizing unit 160, a left sound outputting unit 170, and a right sound outputting unit 180. The reception unit 110 is configured to receive signals, and can be realized by such as a wireless communication module, a wired network module, or an audio jack. The correlation calculation unit 120, the gain calculation unit 140, the transformation unit 150 and the synthesizing unit 160 can be realized by such as a circuit, a chip, a circuit board or a storage device storing a number of codes. The rotation detection unit 130 is configured to detect the user's rotation, and can be realized by such as a gyro, an accelerometer or an infrared detector. The left sound outputting unit 170 and the right sound outputting unit 180 can be realized by such as a headset. Operations of each element of the sound outputting device are disclosed below with an accompanying flowchart.

Figure 3:
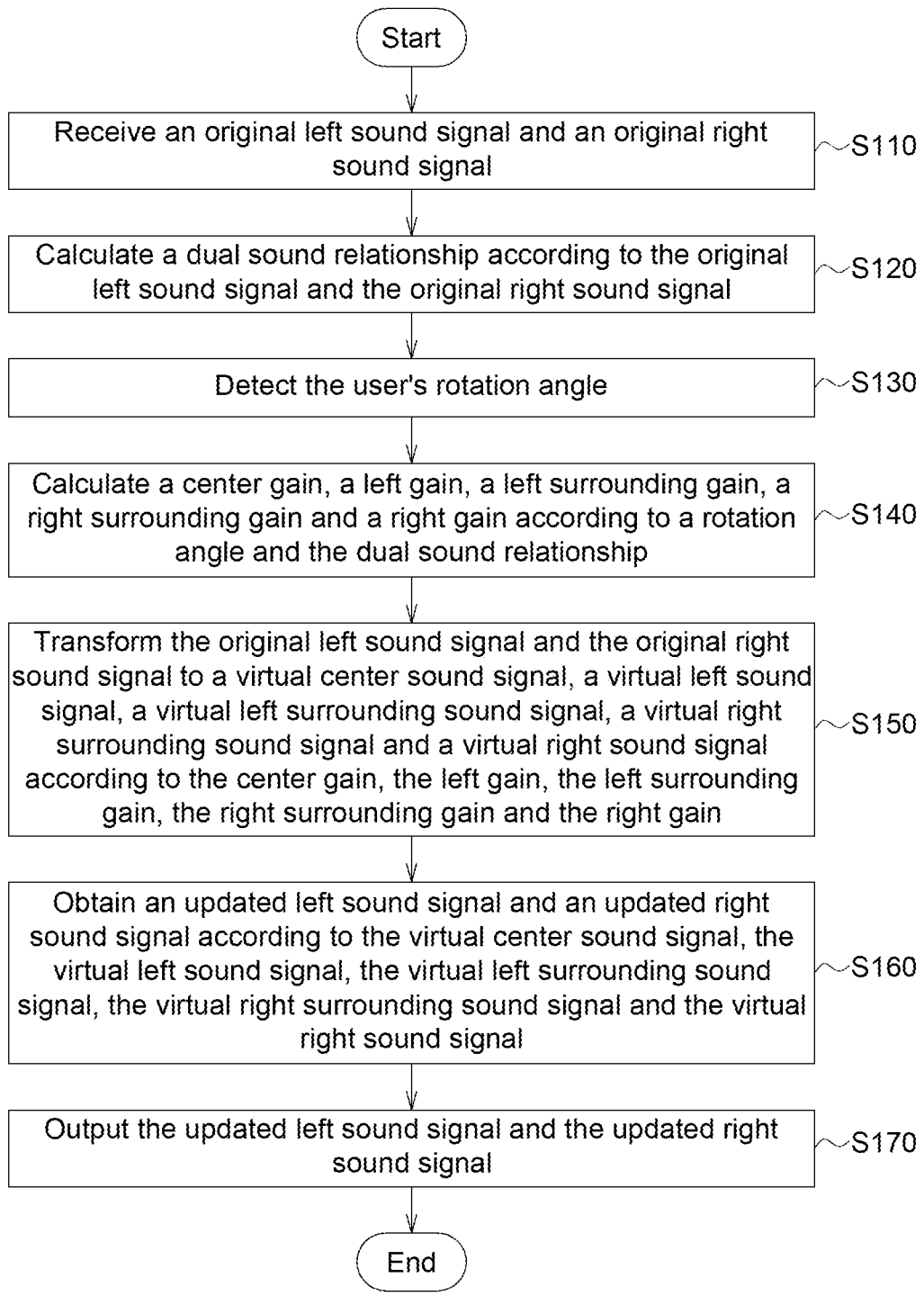
FIG. 3 is a flowchart of a sound effect controlling method with dynamic gain adjustment according to an embodiment.
Figure 4:
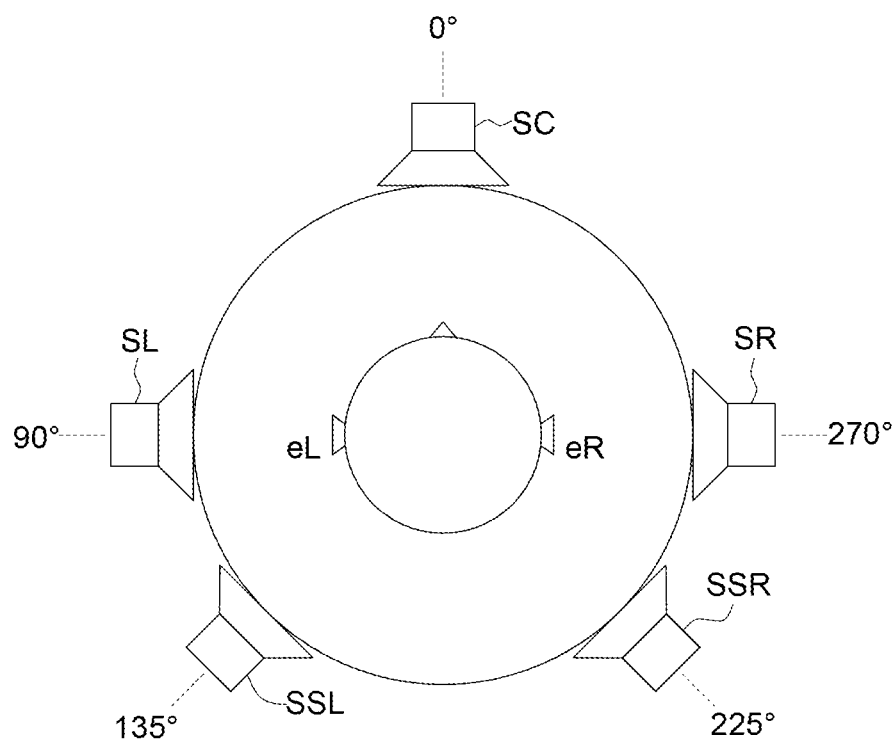
FIG. 4 is a schematic diagram of 5 channels.

Referring to FIG. 3, a flowchart of a sound effect controlling method with dynamic gain adjustment according to an embodiment is shown. Firstly, the method begins at step S110, an original left sound signal eL and an original right sound signal eR are received by the reception unit 110. Conventionally, the original left sound signal eL and the original right sound signal eR are transmitted to the left sound outputting unit 170 and the right sound outputting unit 180 and outputted by the same. Referring to FIG. 4, a schematic diagram of 5 channels is shown. In the present embodiment, the transformation unit 150 transforms the original left sound signal eL and the original right sound signal eR to a virtual center sound signal SC, a virtual left sound signal SL, a virtual left surrounding sound signal SSL, a virtual right surrounding sound signal SSR and a virtual right sound signal SR, which are then combined as an updated left sound signal ZL and an updated right sound signal ZR. Thus, the user can feel a sense of 5-channel stereo presence when listening to the updated left sound signal ZL and the updated right sound signal ZR using the dual-channel sound outputting device 100.

As indicated in FIG. 4, the virtual center sound signal SC is located at 0°, the virtual left sound signal SL is located at 90°, and the virtual right sound signal SR is located at 270°. The virtual left surrounding sound signal SSL is located at 135°, and the virtual right surrounding sound signal SSR is located at 225°. Conventionally, the virtual left sound signal SL is not located at 90°, and the virtual right sound signal SR is not located at 270°. Relevant researches show that, when the virtual left sound signal SL is located at 90° and the virtual right sound signal SR is located at 270°, the virtual left sound signal SL and the virtual right sound signal SR can be best controlled, and best effect of the updated left sound signal ZL and the updated right sound signal ZR can be achieved. Descriptions of the best effect are disclosed after the descriptions of the flowchart.

Then, the method proceeds to step S120, a dual sound relationship RLR is calculated by the correlation calculation unit 120 according to the original left sound signal eL and the original right sound signal eR. For example, the dual sound relationship RLR is obtained according to formula (1). N points are from each of the original left sound signal eL and the original right sound signal eR; eL(n) represents the n-th point of the original left sound signal eL; eR(n) represents the n-th point of the original right sound signal eR.

$$RLR = \frac{2 \cdot \sum_{n=0}^{N} eL(n) \cdot eR(n)}{\sum_{n=0}^{N} eL(n)^2 + \sum_{n=0}^{N} eR(n)^2} \quad (1)$$

Formula (1) shows that when the original left sound signal eL is very similar to the original right sound signal eR, the dual sound relationship RLR is 1. When the original left sound signal eL is not similar to the original right sound signal eR, the dual sound relationship RLR is far less than 1. The dual sound relationship RLR is in a range of 0 to 1.

Figure 5:
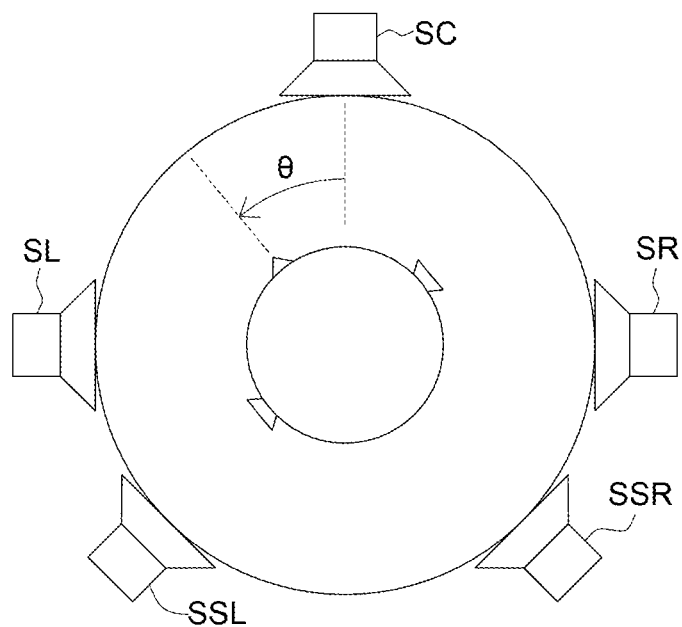
FIG. 5 is a schematic diagram of a rotation angle.

Then, the method proceeds to step S130, a rotation angle θ of the user is detected by the rotation detection unit 130. Referring to FIG. 5, a schematic diagram of a rotation angle θ is shown. The rotation angle θ is such as an angle rotated anti-clockwise.

Then, the method proceeds to step S140, a center gain gC, a left gain gL, a left surrounding gain gSL, a right surrounding gain gSR and a right gain gR are calculated by the gain calculation unit 140 according to the rotation angle θ and the dual sound relationship RLR. For example, the center gain gC, the left surrounding gain gSL and the right surrounding gain gSR are calculated according to a first function f1 disclosed below. The left gain gL and the right gain gR are calculated according to a second function f2 disclosed below.

$$gC = gSL = gSR = f1(\theta, RLR) = \cos^2\theta + 2 \cdot \sin^2\theta \cdot |RLR| \quad (2)$$

$$gL = gR = f2(\theta, RLR) = \cos^2\theta + 2 \cdot \sin^2\theta \cdot (1 - |RLR|) \quad (3)$$

The center gain gC is different from the left gain gL and the right gain gR; the left gain gL and the right gain gR are the same; the center gain gC; the left surrounding gain gSL and the right surrounding gain gSR are the same.

The center gain gC, the left gain gL, the left surrounding gain gSL, the right surrounding gain gSR and the right gain gR can be adjusted according to the current rotation angle θ and the dual sound relationship RLR. When the rotation angle θ is 0°, all of the center gain gC, the left gain gL, the left surrounding gain gSL, the right surrounding gain gSR and the right gain gR are 1. As the rotation angle θ changes, the span of influence of the dual sound relationship RLR also changes. When the rotation angle θ is 90°, if the dual sound relationship RLR is high, then the center gain gC, the left surrounding gain gSL and the right surrounding gain gSR will increase but the left gain gL and the right gain gR will decrease. That is, when the rotation angle is 90°, the center gain gC is positively correlated with the dual sound relationship RLR, but the left gain gL and the right gain gR are negatively correlated with the dual sound relationship RLR.

Then, the method proceeds to step S150, the original left sound signal eL and the original right sound signal eR are transformed to the virtual center sound signal SC, the virtual left sound signal SL, the virtual left surrounding sound signal SSL, the virtual right surrounding sound signal SSR and the virtual right sound signal SR by the transformation unit 150 according to the center gain gC, the left gain gL, the left surrounding gain gSL, the right surrounding gain gSR and the right gain gR. In the present step, an initial center sound signal eC', an initial left sound signal eL', an initial left surrounding sound signal eSL', an initial right surrounding sound signal eSR' and an initial right sound signal eR' are generated by the multi-sound generator 151 according to the original left sound signal eL and the original right sound signal eR. Then, the initial center sound signal eC', the initial left sound signal eL', the initial left surrounding sound signal eSL', the initial right surrounding sound signal eSR' and the initial right sound signal eR' are transformed to a center sound transformation signal SC', a left sound transformation signal SL', a left surrounding sound transformation signal SSL', a right surrounding sound transformation signal SSR' and a right sound transformation signal SR' by the operator 152 using a reverse HRTF algorithm. Then, the result of the reverse HRTF algorithm (that is, the center sound transformation signal SC', the left sound transformation signal SL', the left surrounding sound transformation signal SSL', the right surrounding sound transformation signal SSR' and the right sound transformation signal SR') is multiplied by the center gain gC, the left gain gL, the left surrounding gain gSL, the right surrounding gain gSR and the right gain gR by a multiplier 153 to obtain the virtual center sound signal SC, the virtual left sound signal SL, the virtual left surrounding sound signal SSL, the virtual right surrounding sound signal SSR and the virtual right sound signal SR.

Then, the method proceeds to step S160, the updated left sound signal ZL and the updated right sound signal ZR are obtained by the synthesizing unit 160 according to the virtual center sound signal SC, the virtual left sound signal SL, the virtual left surrounding sound signal SSL, the virtual right surrounding sound signal SSR and the virtual right sound signal SR. In the present step, the updated left sound signal ZL and the updated right sound signal ZR are obtained by the synthesizing unit 160 using a forward HRTF algorithm. That is, the updated left sound signal ZL and the updated right sound signal ZR are obtained by performing the reverse HRTF algorithm and the forward HRTF algorithm to the original left sound signal eL and the original right sound signal eR. In the present embodiment, the accuracy of the reverse HRTF algorithm is increased by using a dynamic gain adjustment technique.

Lastly, the method proceeds to step S170, the left sound outputting unit 170 and the right sound outputting unit 180 are outputted to the updated left sound signal ZL and the updated right sound signal ZR respectively.

Figure 6A:
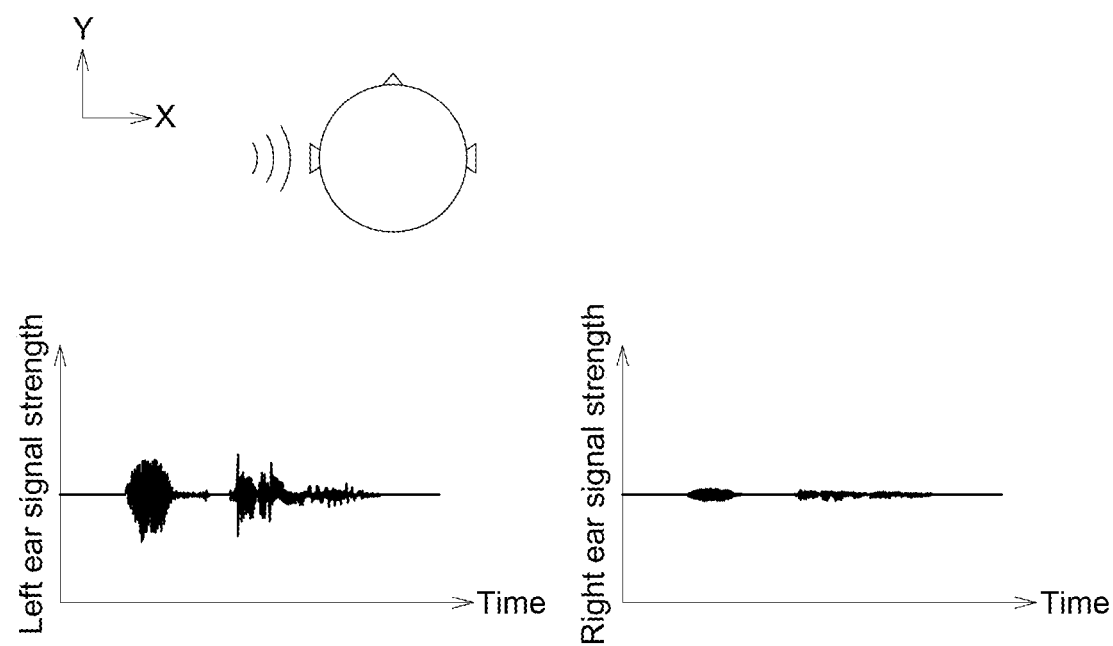
FIG. 6A is a schematic diagram of a left ear signal and a right ear signal which have not been processed with dynamic gain adjustment when the rotation angle is 0° and the sound source is in the negative X-axis direction.
Figure 6B:
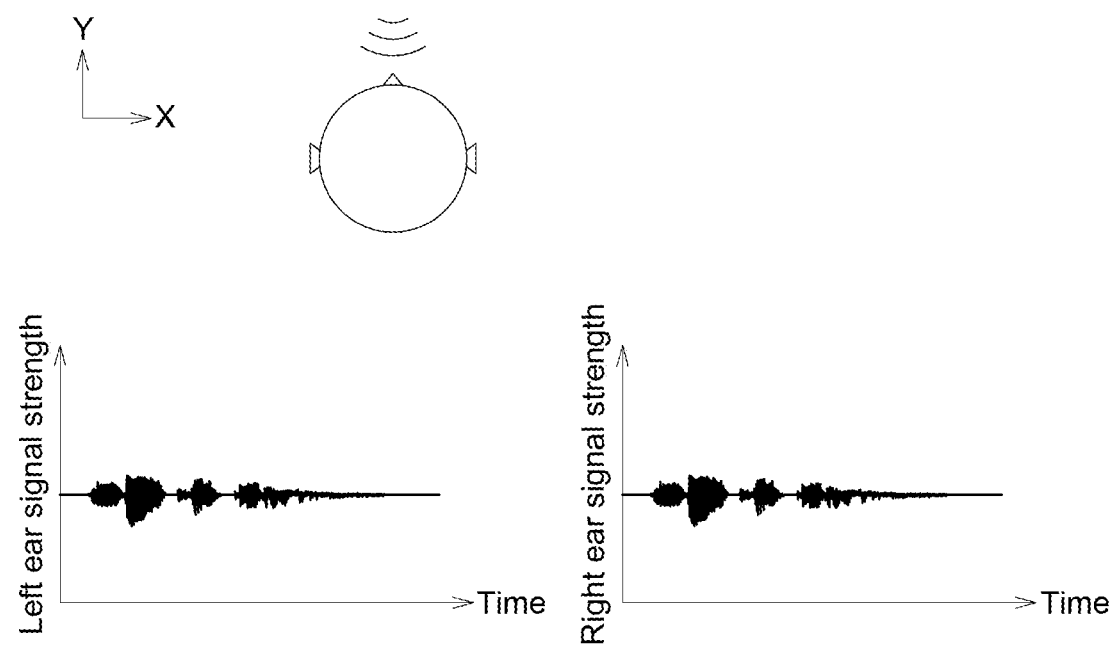
FIG. 6B is a schematic diagram of a left ear signal and a right ear signal which have not been processed with dynamic gain adjustment when the rotation angle is 0° and the sound source is in the positive Y-axis direction.

Refer to FIGS. 6A to 6B. FIG. 6A is a schematic diagram of a left ear signal and a right ear signal which have not been processed with dynamic gain adjustment when the rotation angle is 0° and the sound source is in the negative X-axis direction. As indicated in FIG. 6A, the left ear signal strength is significantly higher than the right ear signal strength, so the user can correctly sense the position of the sound source. FIG. 6B is a schematic diagram of a left ear signal and a right ear signal which have not been processed with dynamic gain adjustment when the rotation angle is 0° and the sound source is in the positive Y-axis direction. As indicated in FIG. 6B, the left ear signal strength and the right ear signal strength are very close to each other, so the user can correctly sense the position of the sound source.

Figure 7A:
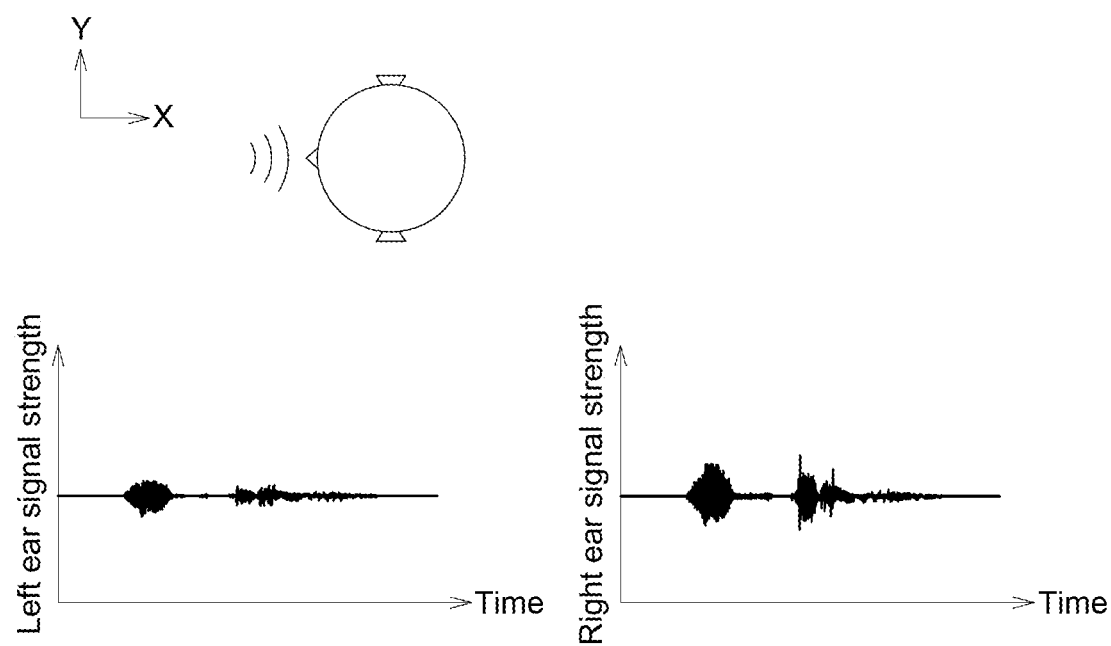
FIG. 7A is a schematic diagram of a left ear signal and a right ear signal which have not been processed with dynamic gain adjustment when the rotation angle is 90° and the sound source is in the negative X-axis direction.
Figure 7B:
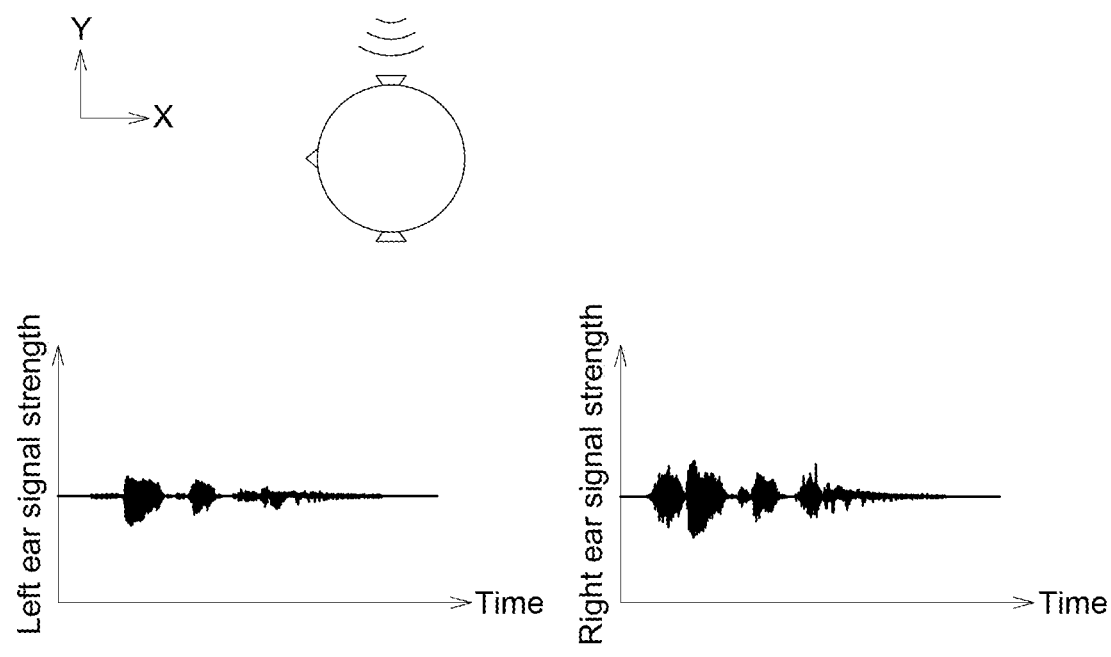
FIG. 7B is a schematic diagram of a left ear signal and a right ear signal which have not been processed with dynamic gain adjustment when the rotation angle is 90° and the sound source is in the positive Y-axis direction.

Refer to FIGS. 7A to 7B. FIG. 7A is a schematic diagram of a left ear signal and a right ear signal which have not been processed with dynamic gain adjustment when the rotation angle is 90° and the sound source is in the negative X-axis direction. As indicated in FIG. 7A, the right ear signal strength is higher than the left ear signal strength 3.5 dB in average, so the user cannot correctly sense the position of the sound source. FIG. 7B is a schematic diagram of a left ear signal and a right ear signal which have not been processed with dynamic gain adjustment when the rotation angle is 90° and the sound source is in the positive Y-axis direction. As indicated in FIG. 7B, the left ear signal strength and the right ear signal strength differ with each other only by 4.5 dB in average, so the user cannot correctly sense the position of the sound source.

As indicated in FIGS. 6A to 7B, without dynamic gain adjustment, the user cannot correctly sense the position of the sound source. In the present embodiment, through the dynamic gain adjustment technique, the user can correctly sense the position of the sound source.

Figure 8A:
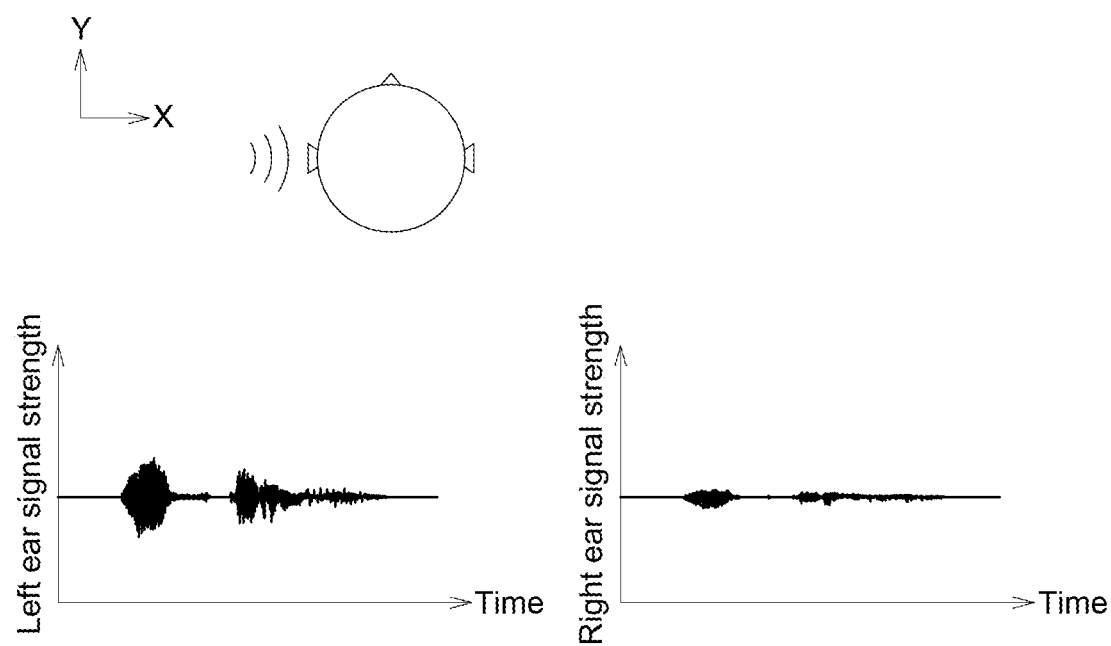
FIG. 8A is a schematic diagram of left ear signal and a right ear signal having been processed with dynamic gain adjustment when the rotation angle is 0° and the sound source is in the negative X-axis direction.
Figure 8B:
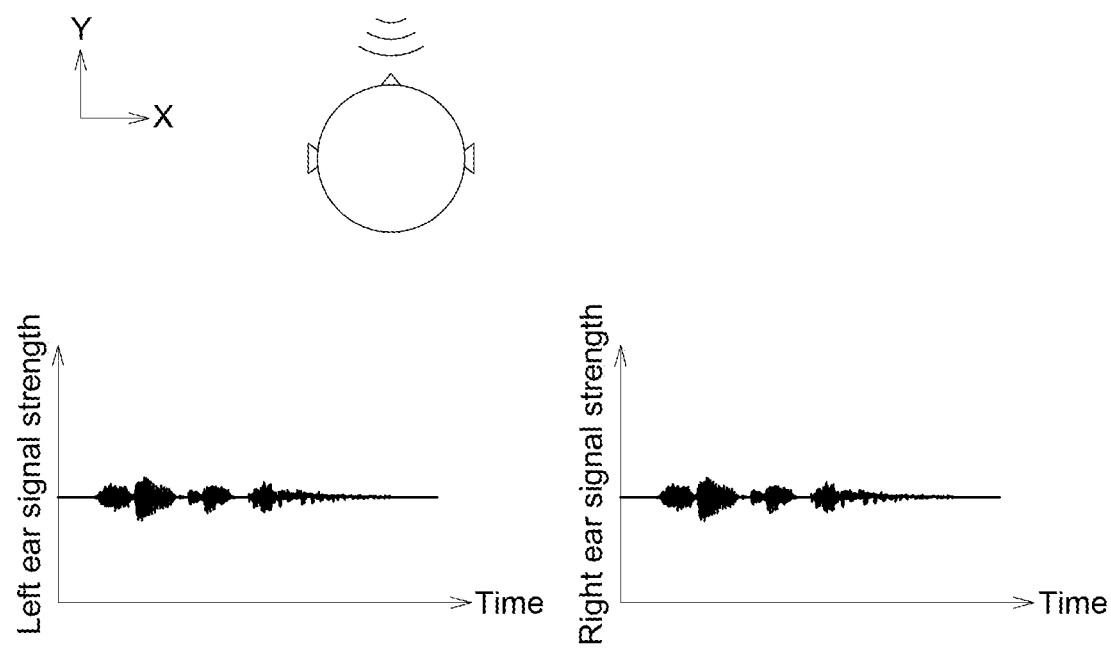
FIG. 8B is a schematic diagram of a left ear signal and a right ear signal having been processed with dynamic gain adjustment when the rotation angle is 0° and the sound source is in the positive Y-axis direction.

Refer to FIGS. 8A to 8B. FIG. 8A is a schematic diagram of left ear signal and a right ear signal having been processed with dynamic gain adjustment when the rotation angle is 0° and the sound source is in the negative X-axis direction. As indicated in FIG. 8A, the left ear signal strength is significantly higher than the right ear signal strength, so the user can correctly sense the position of the sound source. FIG. 8B is a schematic diagram of a left ear signal and a right ear signal having been processed with dynamic gain adjustment when the rotation angle is 0° and the sound source is in the positive Y-axis direction. As indicated in FIG. 8B, the left ear signal strength and the right ear signal strength are close to each other, so the user can correctly sense the position of the sound source.

Figure 9A:
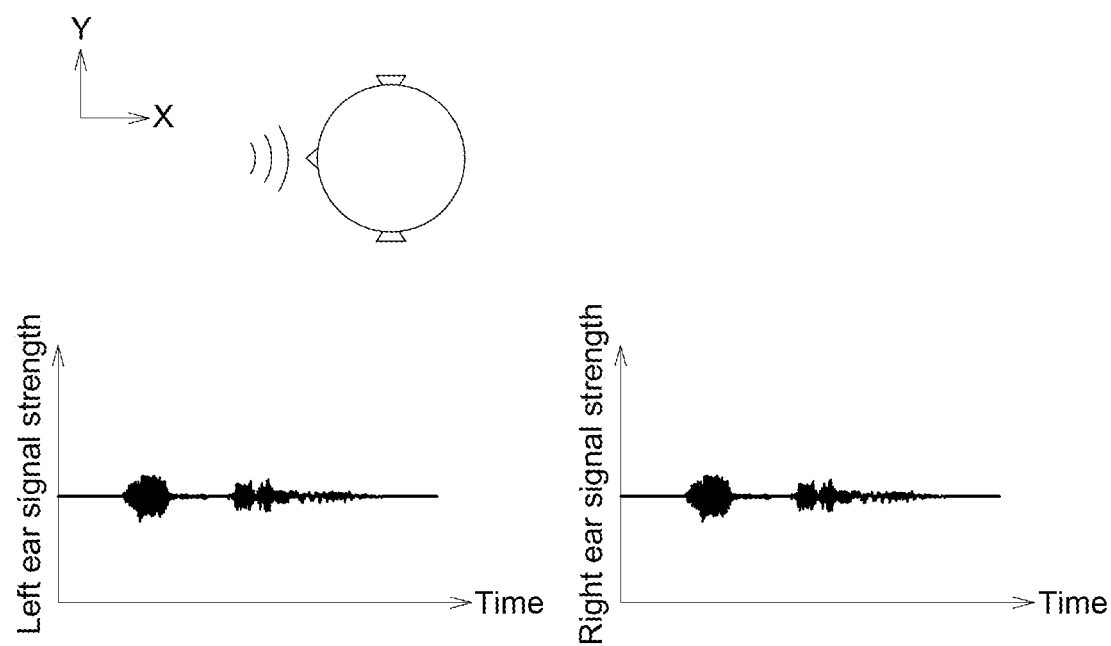
FIG. 9A is a schematic diagram of a left ear signal and a right ear signal having been processed with dynamic gain adjustment when the rotation angle is 90° and the sound source is in the negative X-axis direction.
Figure 9B:
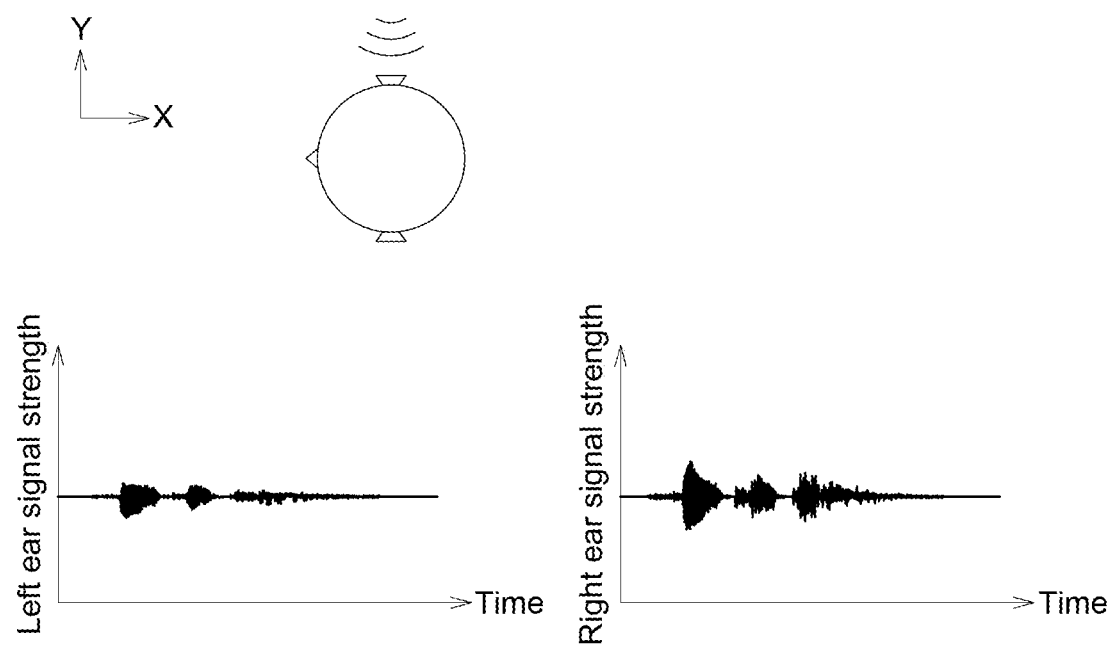
FIG. 9B is a schematic diagram of when the rotation angle is 90° and the sound source is in the positive Y-axis direction, a left ear signal and a right ear signal having been processed with dynamic gain adjustment.

Refer to FIGS. 9A to 9B. FIG. 9A is a schematic diagram of a left ear signal and a right ear signal having been processed with dynamic gain adjustment when the rotation angle is 90° and the sound source is in the negative X-axis direction. As indicated in FIG. 9A, the right ear signal strength and the left ear signal strength differ with each other by 0 dB in average, so the user can correctly sense the position of the sound source. FIG. 9B is a schematic diagram of when the rotation angle is 90° and the sound source is in the positive Y-axis direction, a left ear signal and a right ear signal having been processed with dynamic gain adjustment. As indicated in FIG. 9B, the left ear signal strength and the right ear signal strength differ with each other by 5.5 dB in average, so the user can correctly sense the position of the sound source.

According to the above embodiments, when the virtual center sound signal SC, the virtual left sound signal SL, the virtual left surrounding sound signal SSL, the virtual right surrounding sound signal SSR and the virtual right sound signal SR are arranged at the angles disclosed in the present embodiment, the sense of direction of 5 channels can be effectively increased. Moreover, in the present embodiment, the center gain gC, the left gain gL, the left surrounding gain gSL, the right surrounding gain gSR and the right gain gR are dynamically adjusted according to the rotation angle θ of the user, such that when the user rotates, the virtual center sound signal SC, the virtual left sound signal SL, the virtual left surrounding sound signal SSL, the virtual right surrounding sound signal SSR and the virtual right sound signal SR can be correspondingly adjusted to greatly increase the sense of presence of 5 channels.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A sound effect controlling method with dynamic gain adjustment, comprising:
   receiving an original left sound signal and an original right sound signal;
   calculating a dual sound relationship according to the original left sound signal and the original right sound signal;
   calculating a center gain, a left gain, a left surrounding gain, a right surrounding gain and a right gain according to a rotation angle and the dual sound relationship, wherein the center gain is different from the left gain and the right gain;
   transforming the original left sound signal and the original right sound signal to a virtual center sound signal, a virtual left sound signal, a virtual left surrounding sound signal, a virtual right surrounding sound signal and a virtual right sound signal according to the center gain, the left gain, the left surrounding gain, the right surrounding gain and the right gain; and
   obtaining an updated left sound signal and an updated right sound signal according to the virtual center sound signal, the virtual left sound signal, the virtual left surrounding sound signal, the virtual right surrounding sound signal and the virtual right sound signal.

2. The sound effect controlling method with dynamic gain adjustment according to claim 1, wherein the virtual center sound signal is located at 0°, the virtual left sound signal is located at 90°, and the virtual right sound signal is located at 270°.

3. The sound effect controlling method with dynamic gain adjustment according to claim 2, wherein the virtual left surrounding sound signal is located at 135°, and the virtual right surrounding sound signal is located at 225°.

4. The sound effect controlling method with dynamic gain adjustment according to claim 1, wherein the left gain and the right gain are the same.

5. The sound effect controlling method with dynamic gain adjustment according to claim 1, wherein the center gain, the left surrounding gain and the right surrounding gain are the same.

6. The sound effect controlling method with dynamic gain adjustment according to claim 1, wherein when the rotation angle is 90°, the center gain is positively correlated with the dual sound relationship, but the left gain and the right gain are negatively correlated with the dual sound relationship.

7. The sound effect controlling method with dynamic gain adjustment according to claim 1, wherein the center gain is calculated by using a first function, the left gain and the right gain is calculated by using a second function, and the first function is different from the second function.

8. The sound effect controlling method with dynamic gain adjustment according to claim 7, wherein the first function is $f1(\theta, RLR) = \cos^2\theta + 2 \cdot \sin^2\theta \cdot |RLR|$, f1 is the first function, θ is the rotation angle, and RLR is the dual sound relationship.

9. The sound effect controlling method with dynamic gain adjustment according to claim 7, wherein the second function is $f2(\theta, RLR) = \cos^2\theta + 2 \cdot \sin^2\theta \cdot (1-|RLR|)$, f2 is the second function, θ is the rotation angle, and RLR is the dual sound relationship.

10. The sound effect controlling method with dynamic gain adjustment according to claim 1, wherein the dual sound relationship is calculated by $$RLR = \frac{2 \cdot \sum_{n=0}^{N} eL(n) \cdot eR(n)}{\sum_{n=0}^{N} eL(n)^2 + \sum_{n=0}^{N} eR(n)^2},$$

RLR is the dual sound relationship, eL(n) is a n-th point of the original left sound signal, and eR(n) is a n-th point of the original right sound signal.

11. A sound outputting device with dynamic gain adjustment, comprising:
   a reception unit configured to receive an original left sound signal and an original right sound signal;
   a correlation calculation unit configured to calculate a dual sound relationship according to the original left sound signal and the original right sound signal;
   a gain calculation unit configured to calculate a center gain, a left gain, a left surrounding gain, a right surrounding gain and a right gain according to a rotation angle and the dual sound relationship, wherein the center gain is different from the left gain and the right gain;
   a transformation unit configured to transform the original left sound signal and the original right sound signal to a virtual center sound signal, a virtual left sound signal, a virtual left surrounding sound signal, a virtual right surrounding sound signal and a virtual right sound signal according to the center gain, the left gain, the left surrounding gain, the right surrounding gain and the right gain; and
   a synthesizing unit configured to obtain an updated left sound signal and an updated right sound signal according to the virtual center sound signal, the virtual left sound signal, the virtual left surrounding sound signal, the virtual right surrounding sound signal and the virtual right sound signal.

12. The sound outputting device with dynamic gain adjustment according to claim 11, wherein the virtual center sound signal is located at 0°, the virtual left sound signal is located at 90°, and the virtual right sound signal is located at 270°.

13. The sound outputting device with dynamic gain adjustment according to claim 12, wherein the virtual left surrounding sound signal is located at 135°, and the virtual right surrounding sound signal is located at 225°.

14. The sound outputting device with dynamic gain adjustment according to claim 12, wherein the left gain and the right gain are the same.

15. The sound outputting device with dynamic gain adjustment according to claim 12, wherein the center gain, the left surrounding gain and the right surrounding gain are the same.

16. The sound outputting device with dynamic gain adjustment according to claim 12, wherein when the rotation angle is 90°, the center gain is positively correlated with the dual sound relationship, but the left gain and the right gain are negatively correlated with the dual sound relationship.

17. The sound outputting device with dynamic gain adjustment according to claim 12, wherein the center gain is calculated by using a first function, the left gain and the right gain is calculated by using a second function, and the first function is different from the second function.

18. The sound outputting device with dynamic gain adjustment according to claim 17, wherein the first function is $f1(\theta, RLR) = \cos^2\theta + 2\cdot\sin^2\theta\cdot|RLR|$, f1 is the first function, $\theta$ is the rotation angle, and RLR is the dual sound relationship.

19. The sound outputting device with dynamic gain adjustment according to claim 17, wherein the second function is $f2(\theta, RLR) = \cos^2\theta + 2\cdot\sin^2\theta\cdot(1-|RLR|)$, f2 is the second function, $\theta$ is the rotation angle, and RLR is the dual sound relationship.

20. The sound outputting device with dynamic gain adjustment according to claim 11, wherein the dual sound relationship is calculated by $$RLR = \frac{2\cdot\sum_{n=0}^{N} eL(n)\cdot eR(n)}{\sum_{n=0}^{N} eL(n)^2 + \sum_{n=0}^{N} eR(n)^2},$$

RLR is the dual sound relationship, eL(n) is a n-th point of the original left sound signal, and eR(n) is a n-th point of the original right sound signal.

* * * * *